US012662391B2

(12) United States Patent
Kanatzidis et al.

(10) Patent No.: US 12,662,391 B2
(45) Date of Patent: Jun. 23, 2026

(54) METHODS OF GROWING LARGE CRYSTALS OF ALL-INORGANIC AND HYBRID ORGANIC-INORGANIC CESIUM LEAD BROMIDE PEROVSKITES FROM SOLUTION

(71) Applicant: Northwestern University, Evanston, IL (US)

(72) Inventors: Mercouri G. Kanatzidis, Wilmette, IL (US); Yucheng Liu, Evanston, IL (US); Lei Pan, Evanston, IL (US)

(73) Assignee: Northwestern University, Evanston, IL (US)

( * ) Notice: Subject to any disclaimer, the term of this patent is extended or adjusted under 35 U.S.C. 154(b) by 376 days.

(21) Appl. No.: 18/274,401

(22) PCT Filed: Mar. 24, 2022

(86) PCT No.: PCT/US2022/071298
§ 371 (c)(1),
(2) Date: Jul. 26, 2023

(87) PCT Pub. No.: WO2022/204701
PCT Pub. Date: Sep. 29, 2022

(65) Prior Publication Data
US 2024/0083765 A1 Mar. 14, 2024

Related U.S. Application Data

(60) Provisional application No. 63/166,480, filed on Mar. 26, 2021.

(51) Int. Cl.
*C30B 7/02* (2006.01)
*C01G 21/00* (2006.01)

(52) U.S. Cl.
CPC .............. *C01G 21/006* (2013.01); *C30B 7/02* (2013.01)

(58) Field of Classification Search
CPC .... C30B 7/00; C30B 7/02; C30B 7/06; C30B 7/14; C30B 19/00; C30B 19/02;
(Continued)

(56) References Cited

U.S. PATENT DOCUMENTS 9,895,714 B2 2/2018 Cornell et al.
11,249,203 B2 2/2022 Kanatzidis et al.
(Continued)

FOREIGN PATENT DOCUMENTS

WO WO 2016/024159 A1 2/2016
WO WO 2020/081412 A1 4/2020

OTHER PUBLICATIONS

Kim, Kyeong Su, et al. "Methylammonium iodide-mediated controlled crystal growth of CsPbI2Br films for efficient and stable all-inorganic perovskite solar cells." *ACS applied materials & interfaces* 12.32 (2020): 36228-36236.
(Continued)

*Primary Examiner* — Kenneth A Bratland, Jr.
(74) *Attorney, Agent, or Firm* — Bell & Manning, LLC

(57) ABSTRACT

Methods of growing large, free-standing single crystals of $(FA_xCs_{1-x})PbBr_3$ perovskites, where $0 \leq x < 1$, in solution using tertiary or ternary alkyl ammonium salts, weak organic acids, or a combination thereof are provided. By including the additives in a crystallization solution with perovskite precursors, larger single crystals can be grown by slow evaporation or inverse temperature crystallization than would possible in the absence of the additives under the same growth conditions.

10 Claims, 8 Drawing Sheets

(58) Field of Classification Search

CPC ......... C30B 19/10; C30B 29/00; C30B 29/10; C30B 29/12; C30B 29/16; C30B 29/22; C30B 29/24; C30B 29/54; C30B 29/60; C30B 29/64; C01G 21/006; C01G 21/02

USPC ......... 117/11, 54, 64, 68, 70, 925, 937, 940, 117/947

See application file for complete search history.

(56) References Cited

U.S. PATENT DOCUMENTS

| | | | |
|---|---|---|---|
| 2016/0251303 A1* | 9/2016 | Moore | B05D 1/005 428/220 |
| 2017/0217785 A1* | 8/2017 | Yang | H10K 85/50 |
| 2017/0236651 A1* | 8/2017 | Bakr | C30B 29/12 136/263 |
| 2018/0334759 A1* | 11/2018 | Wei | C30B 29/12 |
| 2020/0028022 A1 | 1/2020 | Huang et al. | |
| 2020/0189926 A1* | 6/2020 | van Hest | H10K 85/50 |
| 2020/0189927 A1* | 6/2020 | Whitaker | C03C 17/38 |

OTHER PUBLICATIONS

Jin, In Su, Bhaskar Parida, and Jae Woong Jung. "Simultaneously enhanced efficiency and ambient stability of inorganic perovskite solar cells by employing tetramethylammonium chloride additive in CsPbl2Br." *Journal of Materials Science & Technology* 102 (2022): 224-231.

Liu, Jieqiong, et al. "Remarkable quality improvement of CsPbIBr2 perovskite film by cellulose acetate addition for efficient and stable carbon-based inorganic perovskite solar cells." *Chemical Engineering Journal* 424 (2021): 130324.

Xiaopeng Zheng et al., "Reducing Defects in Halide Perovskite Nanocrystals for Light-Emitting Applications," *J. Phys. Chem. Lett.* 2019, 10, 2629-2640.

Seckin Akin et al., "Organic Ammonium Halide Modulators as Effective Strategy for Enhanced Perovskite Photovoltaic Performance," *Advanced Science* 2021, 8, 2004593 (1 of 24).

Soranyel Gonzalez-Carrero et al., "Organic-inorganic and all-inorganic lead halide nanoparticles [Invited]," *Optics Express* Jan. 25, 2016, vol. 24, No. 2; pp. A285-A301.

Mazhar Abbas et al., "A Critical Review on Crystal Growth Techniques for Scalable Deposition of Photovoltaic Perovskite Thin Films," *Materials* 2020, 13, 4851; pp. 1-41. DOI:10.3390/ma13214851.

Yusheng Lei et al., "Single-crystal halide perovskites: Opportunities and challenges," *Matter* 4, 2266-2308, Jul. 7, 2021.

Pavao Andricevic et al., "Kilogram-Scale Crystallogenesis of Halide Perovskites for Gamma-Rays Dose Rate Measurements," *Adv. Sci.* 2021, 8, 2001882 (1 of 9).

Hongjian Zhang et al., Pre-publication of the article: "Centimeter-Sized Inorganic Lead Halide Perovskite CsPbBr3 Crystals Grown by an Improved Solution Method," *Cryst. Growth Des.* 17, 12 (Publicly available on or before Oct. 25, 2017); pp. A-F.

Yucheng Liu et al., "Inch-sized high-quality perovskite single crystals by suppressing phase segregation for light-powered integrated circuits," *Sci. Adv.* Feb. 10, 2021, 7: eabc8844; pp. 1 of 12.

Zhi Li et al., "Robot-Accelerated Perovskite Investigation and Discovery," *Chem. Mater.* 2020, 32, 5650-5663.

Lv, Qianrui, et al. "Formic acid: an accelerator and quality promoter for nonseeded growth of CH 3 NH 3 PbI 3 single crystals." *Chemical Communications* 54.9 (2018): 1049-1052.

Ahmed, Yameen, et al. "Organic additives in all-inorganic perovskite solar cells and modules: from moisture endurance to enhanced efficiency and operational stability." *Journal of Energy Chemistry* 67 (2022): 361-390.

Meng, Lina, et al. "Improved perovskite solar cell efficiency by tuning the colloidal size and free ion concentration in precursor solution using formic acid additive." *Journal of Energy Chemistry* 41 (2020): 43-51.

Nakita K. Noel et al., "Unveiling the Influence of pH on the Crystallization of Hybrid Perovskites, Delivering Low Voltage Loss Photovoltaics," *Joule*, Oct. 11, 2017, 1, 328-343.

Saad Ullah et al., "All-inorganic CsPbBr3 perovskite: a promising choice for photovoltaics," *Mater. Adv.*, 2021, 2, 646.

Zhi Li et al., Pre-publication of the article: "Dimensional control over metal halide perovskite crystallization guided by active learning," *Chemistry of Materials* 34, 2 (Publicly available on or before Jan. 12, 2022); pp. 1-57.

Zhipeng Lian et al., "Perovskite CH3NH3PbI3(CI) Single Crystals: Rapid Solution Growth, Unparalleled Crystalline Quality, and Low Trap Density toward 108 cm-3," *J. Am. Chem. Soc.* 2016, 138, 9409-9412.

Shuang Liu et al., "A Review on Additives for Halide Perovskite Solar Cells," *Adv. Energy Mater.* 2019, 1902492 (1 of 28).

The International Search Report and the Written Opinion issued on May 23, 2022 for international patent application No. PCT/US22/71298; pp. 1-10.

* cited by examiner

METHODS OF GROWING LARGE CRYSTALS OF ALL-INORGANIC AND HYBRID ORGANIC-INORGANIC CESIUM LEAD BROMIDE PEROVSKITES FROM SOLUTION

CROSS-REFERENCE TO RELATED APPLICATIONS

The present application is a National Stage of International Application No. PCT/US22/71298, filed Mar. 24, 2022, which claims priority to U.S. provisional patent application No. 63/166,480, filed Mar. 26, 2021, the entire contents of both of which are incorporated herein by reference.

BACKGROUND

Highly sensitive hard X-ray and $\gamma$-ray radiation detectors with large volume and high energy resolution (ER) based on scintillators and semiconductors play a critical role in homeland security, with broad industrial and biomedical applications. The commercially viable semiconductors for $\gamma$-ray detection are high-purity Ge (HPGe) and cadmium telluride (CdTe)-based materials, which have been known since the 1950s. The HPGe detector is generally recognized as the gold standard for radiation detection due to its superior energy resolution, but its narrow intrinsic bandgap limits it to operation only at liquid nitrogen temperatures. Competitive semiconductor materials that can detect X-rays with high sensitivity at room temperature over long periods have been long pursued but with limited success. The alloy $Cd_{1-x}Zn_xTe$ (x~0.1, CZT) has achieved commercialization but presents high manufacturing cost and unresolved growth issues.

The advent of halide perovskite materials, which have the formula $ABX_3$ (where A is an inorganic or small organic cation, B is a metallic cation, and X is a halogen) has impacted the field of $\gamma$-rays detection, which is a highly demanding application for a semiconductor because of the very strict criteria and severe quality constraints placed on them. An advantage of the halide perovskites is their ability to provide high charge transport at purity levels that are orders of magnitude lower than those required for more established hard radiation detector materials, due to their inherent defect tolerant nature.

The development of halide perovskite based electronic devices has focused heavily on polycrystalline films due to the relative ease for film formation. However, thin halide perovskite films are typically characterized by a high density of defects, such as point defects, impurities, grain boundaries, and residual inclusions, which degrade the properties of the devices made therefrom. Halide perovskite single crystals generally exhibit a much lower density of defects due to their ordered lattice arrangement. Therefore, free-standing perovskite single crystals are superior to thin films for many applications. However, in order to be useful single crystals of halide perovskites must be large and preferably square or rectangular with a low rectangle aspect ratio.

Large all-inorganic halide perovskite crystals can be grown from a melt by cooling the molten compound through its crystallization point using a Bridgman method or a melting cooling method. However, solution growth of halide perovskite crystals is more appealing because it can be done at relatively low temperatures, can be scaled up, and does not require complicated or expensive equipment. Unfortunately, while a few halide perovskites, such as the hybrid organic-inorganic perovskite materials $MAPbX_3$ and $FAPbX_3$ (where X=Cl, Br, I, MA, or FA; where FA is formamidinium ($HC(NH_2)_2^+$, and MA is methylammonium ($CH_3NH_3^+$)), have been grown as large (e.g., ~1 cm size) crystals in solution, most halide perovskites, and particular those in which A includes a metal cation, have only be grown in solution as small crystals, typically having sizes of a few millimeters or smaller.

Attempts have been made to increase the size of halide perovskite crystals grown in solution using various additives. However, no additive has been found to be effective across different halide perovskites and the mechanisms by which the various additives that have been tried is not well understood. Therefore, the a priori identification of suitable additives for particular halide perovskites has not been possible.

The all-inorganic perovskite $CsPbBr_3$ and hybrid perovskite $(FA,Cs)PbBr_3$ are two hard radiation (e.g., X- and $\gamma$-ray) detector materials with a lot of potential; however, they have met with limited success due to the inability to grow sufficiently large free-standing single crystals of these perovskites.

SUMMARY

Methods of growing large, free-standing single crystals of $(FA_xCs_{1-x})PbBr_3$ perovskites, where $0 \leq x < 1$, in solution using alkyl ammonium salt additives, weak organic acid additives, or a combination thereof are provided.

One embodiment of a method for growing perovskite single-crystals having the formula $(FA_xCs_{1-x})PbBr_3$, where $0 \leq x < 1$, includes the steps of: (a) forming a crystallization solution comprising: (i) one or more $(FA_xCs_{1-x})PbBr_3$ perovskite precursors; and (ii) one or more alkyl ammonium salts having the formula $R_{(4-x)}H_xNX$, where the Rs are alkyl groups selected from methyl groups, ethyl groups, propyl groups, butyl groups, and combinations thereof, x has a value of 0 or 1, and X is a halide anion, nitrate anion, acetate anion, perchlorate anion, or sulfate anion dissolved in an organic solvent; and (b) maintaining or ramping up the temperature of the crystallization solution for a time sufficient for solvent to evaporate and the perovskite precursors to react and form a $(FA_xCs_{1-x})PbBr_3$ perovskite single crystal. The method may optionally further include the step of transferring the $(FA_xCs_{1-x})PbBr_3$ perovskite single crystal to a fresh batch of crystallization solution and maintaining or ramping up the temperature of the fresh crystallization solution for a time sufficient for solvent to evaporate and the perovskite precursors to react and increase the size of the $(FA_xCs_{1-x})PbBr_3$ perovskite single crystal.

Another embodiment of a method for growing perovskite single-crystals having the formula $(FA_xCs_{1-x})PbBr_3$, where $0 \leq x < 1$, includes the steps of: (a) forming a crystallization solution comprising: (i) one or more $(FA_xCs_{1-x})PbBr_3$ perovskite precursors; and (ii) one or more weak organic acids dissolved in an organic solvent; and (b) maintaining or ramping up the temperature of the crystallization solution for a time sufficient for solvent to evaporate and the perovskite precursors to react and form a $(FA_xCs_{1-x})PbBr_3$ perovskite single crystal. The method may optionally include the additional step of transferring the $(FA_xCs_{1-x})PbBr_3$ perovskite single crystal to a fresh batch of crystallization solution and maintaining or ramping up the temperature of the fresh crystallization solution for a time sufficient for solvent to evaporate and the perovskite precursors to react and increase the size of the $(FA_xCs_{1-x})PbBr_3$ perovskite single crystal.

The $(FA_xCs_{1-x})PbBr_3$ perovskite single crystals grown using the methods described herein are large and have low aspect ratios—having, for example, at least one lateral dimension of 6 mm or greater and a square shape or a rectangular shape with a rectangle aspect ratio of 3:1 or less.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings.

DETAILED DESCRIPTION

Figure 1B:
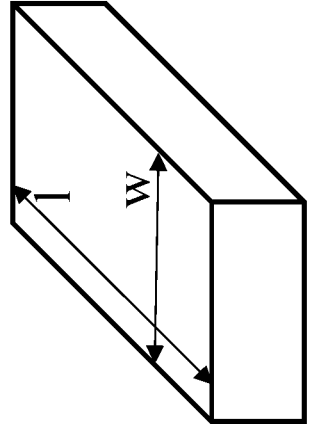
FIG. 1B is a schematic representation of a rectangular single crystal.

Methods of growing large, free-standing single crystals of $(FA_xCs_{1-x})PbBr_3$ perovskites, where $0 \leq x < 1$, in solution using alkyl ammonium salt additives, weak organic acid additives, or a combination thereof are provided. By including the additives in a crystallization solution with perovskite precursors, larger single crystals can be grown by slow evaporation and/or inverse temperature crystallization than would be possible in the absence of the additives under the same growth conditions. With the aid of the additives, single crystals of $(FA_xCs_{1-x})PbBr_3$ perovskites having at least one lateral dimension of 6 mm or larger and a low aspect ratio can be grown in solution.

The crystals are grown in a crystallization solution that includes one or more $(FA_xCs_{1-x})PbBr_3$ perovskite precursors and one or more of the additives dissolved in an organic solvent. The preparation of the crystallization solution may be carried out in two steps, whereby a precursor solution that includes the perovskite precursors dissolved in the organic solvent is formed initially and the one or more additives are subsequently added to the precursor solution and dissolved to form the crystallization solution. The crystallization solution is then maintained at an elevated temperature or has its temperature ramped up across a range of elevated temperatures over a time period sufficient to allow for $(FA_xCs_{1-x})PbBr_3$ perovskite single crystal formation from the $(FA_xCs_{1-x})PbBr_3$ perovskite precursors in the presence of the additives.

In some embodiments of the methods, the additives are tertiary or ternary alkyl ammonium salts having the formula $R_{(4-x)}H_xNX$, where the Rs are alkyl groups selected from methyl groups, ethyl groups, propyl groups, butyl groups, and combinations thereof, x has a value of 0 or 1, and X is a halide anion, such as Br, Cl, or I, a nitrate anion, an acetate anion, a perchlorate anion, and/or a sulfate anion. Because crystal size tends to decrease for larger alkyl groups, the Rs are more desirably selected from methyl groups, ethyl groups, propyl groups, and/or combinations thereof.

In other embodiments of the methods, the additives are weak organic acids (that is, organic acids having a $K_a$ of less than 1), examples of which include formic acid, acetic acid, propionic acid, and oxalic acid.

The concentration of the additives in the crystallization solution is a concentration at which they are able to carry out the function of enhanced single crystal growth. Typical concentrations are in the range from 0.001 mmol/mL to 0.1 mmol/mL. However, concentrations outside of this range can be used.

The $(FA_xCs_{1-x})PbBr_3$ perovskite precursors are two or more molecules that collectively contain all of the elements of the $(FA_xCs_{1-x})PbBr_3$ perovskite and that react in the crystallization solution to form a single crystal of the perovskite. In some embodiments of the methods, the precursors are selected such that they collectively contain only elements of the final $(FA_xCs_{1-x})PbBr_3$ perovskite. For the all-inorganic perovskite (x=0), the precursors will typically take the form of inorganic salts, such as CsBr, $PbBr_2$, and/or PbBr, while the precursors for the hybrid $(FA_xCs_{1-x})PbBr_3$ perovskite will typically include a formamidine salt, such as formamidine bromide, in addition to inorganic precursors, such as CsBr, $PbBr_2$, and/or PbBr.

The organic solvent may be a single solvent or a solvent mixture, provided that the perovskite precursors and the additives are sufficiently soluble therein and, for ITC growth, further provided that the solubility of the $(FA_xCs_{1-x})PbBr_3$ perovskite varies sufficiently as a function of temperature in that organic solvent. Suitable solvents for the growth of single crystal $(FA_xCs_{1-x})PbBr_3$ perovskites include dimethylsulfoxide (DMSO), $\gamma$-butyrolactone (GBL), dimethylformamide (DMF), and mixtures of two or more thereof. Generally, CsPbBr3 crystals can be grown using DMSO as the organic solvent, while a mixture of two or more of these may be used as the organic solvent for the growth of $(FA_xCs_{1-x})PbBr_3$ $(0 \leq x < 1)$ crystals.

The growth of the final single crystal $(FA_xCs_{1-x})PbBr_3$ perovskite can be carried out in a single growth step in the original crystallization solution. Alternatively, the original crystallization solution can be used to grow seed crystals which are transferred from the original crystallization solution to a fresh crystallization solution in which the final single crystal $(FA_xCs_{1-x})PbBr_3$ perovskite is grown from the seed crystal by slow evaporation or inverse temperature crystallization (ITC). Like the original crystallization solution, the fresh crystallization solution comprises $(FA_xCs_{1-x})PbBr_3$ perovskite precursors and the additives are dissolved in an organic solvent. The seeded growth step can be carried out once or more than once iteratively to increase the size of the single crystal.

Crystal growth by solvent evaporation is a simple method to obtain large single crystals of the $(FA_xCs_{1-x})PbBr_3$ perovskites. During growth by slow evaporation, the organic solvent is allowed to evaporate under controlled heating, until crystallization takes place. The crystallization solution may begin as a saturated solution in order to enable crystal growth, or may become saturated during the initial stages of solvent evaporation.

During ITC growth, the solubility of the perovskite decreases in the selected organic solvent as the temperature of the solution increases, such that the crystallization temperature solution reaches supersaturation as a result of heating, enabling single crystal growth.

Simple evaporative crystallization and ITC are generally carried out at elevated temperatures, where an elevated temperature is a temperature attained by heating the precursor solution or crystallization solution above standard room temperature (23° C.). Typical elevated temperatures for the dissolution of the precursors and/or additives in a precursor solution and/or for carrying out non-seeded and/or seeded single crystal growth are in the range from 45° C. to 130° C., and more typically in the range from 50° C. to 110° C. However, temperatures outside of these ranges can be used, keeping in mind that lower temperatures will generally increase the time for crystal formation. The crystallization process is carried out for a time sufficient to form a large single crystal—generally a period of at least one day and more commonly at least four days. During simple evaporative crystallization, the crystallization solution can be maintained at a steady temperature, while the temperature is ramped up across a range of elevated temperatures during ITC. The temperature ramp up may be conducted at a steady rate or be step-wise. By way of illustration only, the temperature of a crystallization solution could be increased by an amount of 20° C. to 60° C., starting at a temperature in the range from 50° C. to 60° C., over the course of a time period lasting in the range from 5 to 15 days. For a single step (non-seeded) single crystal growth process, the single growth step may be carried out at the temperatures and time period disclosed herein. For a seeded growth process, each of the steps may be carried out at the temperatures and time periods disclosed herein. However, these times and temperatures are provided only as illustration.

One illustrative embodiment of a method for the growth of a large, low aspect ratio $(FA_xCs_{1-x})PbBr_3$ perovskite single crystal includes the following steps. A stoichiometric molar ratio of the perovskite precursors is dissolved in an organic solvent to prepare a precursor solution in a container. The container may be sealed using, for example, plastic wrap, to exclude dust, particulates, and other contaminants from the environment. Heating and/or stirring may be used to promote dissolution of the precursors. Once the precursor solution has been prepared, one or more additives are added to the precursor solution to form a crystallization solution. Heating and/or stirring may be used to promote the dissolution of the additives. Optionally, the crystallization solution may be filtered to remove insoluble impurities. The crystallization solution is then transferred to an oven to maintain the crystallization solution at a suitable crystallization temperature or to ramp the crystallization solution over a suitable temperature range to promote single crystal growth. The growth may continue until a crystal of a desired size is achieved. Alternatively, crystal growth in the initial crystallization solution can be interrupted and one or more of the resulting crystals can be transferred to a fresh crystallization solution that is transferred to the oven to maintain the fresh crystallization solution at a suitable crystallization temperature or to ramp the crystallization solution over a suitable temperature range to promote further growth of the $(FA_xCs_{1-x})PbBr_3$ perovskite single crystals. The final single crystals can then be removed from the solution and washed.

Figure 1A:
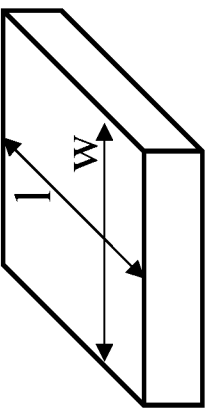
FIG. 1A is a schematic representation of a square single crystal.

Using either the unseeded or seeded crystal growth methods described herein, $(FA_xCs_{1-x})PbBr_3$ (0≤x<1) free-standing single crystals having at least one lateral dimension of 6 mm and a low aspect ratio can be formed, where the lateral dimensions are the length (l) and width (w) of a single crystal, as shown schematically in FIGS. 1A and 1B. This includes $(FA_xCs_{1-x})PbBr_3$ (0≤x<1) single crystals having at least one lateral dimension of at least 8 mm or at least 10 mm. For example, single crystals having at least one lateral dimension in the range from 6 mm to 20 mm or larger can be grown. The aspect ratio (l:w) may be 1:1 in the case of a square crystal (FIG. 1A) or greater than 1 in the case of a rectangular crystal (FIG. 1). However, even in the case of rectangular crystals, the present methods are able to produce crystals with low rectangle aspect ratios (l:w), including aspect ratios of 3:1 or lower, 2:1 or lower, 1.5:1 or lower, and 1.2:1 or lower. The thickness of the single crystals may be smaller than the length and width dimensions but is still on the mm scale. Thus, the single crystals may have thicknesses of 1 mm or larger, including thicknesses of 2 mm or larger, and 3 mm or larger. By way of illustration, single crystals having a thickness in the range from 1 mm to 6 mm or greater can be grown.

EXAMPLES

Example 1: Large $CsPbBr_3$ Single Crystals Made with an Alkyl Ammonium Halide Additive Preparation of Precursor Solution A total of 0.05 mol of unpurified CsBr (≥99%, Alfa Aesar) precursor, together with 0.1 mol of unpurified $PbBr_2$ (≥98%, Alfa Aesar) precursor was dissolved in 48.5 mL of dimethyl sulfoxide (DMSO, ≥99.5%) solvent with continuous stirring for 24 h at 60° C. on a hot plate. A mole ratio of $PbBr_2$ and CsBr of around 2:1 was used to form pure $CsPbBr_3$ crystals. After all the raw materials were dissolved, 4.85 mmol of tetramethyl ammonium bromide (TMAB) was added into the 48.5 mL solution with continuous stirring for 24 h at 60° C. on a hot plate to form a crystallization solution. The solution was then filtered using a membrane with a 5 µm and 0.22 µm pore size subsequently to remove any insoluble impurities.

Unseeded Growth of Square-Shaped and Rectangular Crystals of $CsPbBr_3$ Single Crystals of at Least 8 mm in Length $CsPbBr_3$ single crystals were grown by evaporative precipitation from the crystallization solution. While still at 60° C., 40 mL of clear crystallization solution was put in either a 100 mm or 25 mm diameter crystallization dish. Each container was sealed with plastic wrap and a rubber band, which was then put into an FO Series 110V Oven (Across International) for crystal growth. For the 100 mm crystallization dishes, the initial temperature of the oven at solution input was 60° C. before subsequent ramp up to 85° C. at a steady rate over 7 days. For the 25 mm crystallization dishes, the initial temperature of the oven at solution input was 85° C., which was held constant.

This single crystal growing process lasted a maximum of 7 days for the 100 mm dishes and a maximum of 10 days for the 25 mm dishes. To remove crystals for seeded growth, growth was interrupted early at 5 days before continuing. Crystallization dishes were taken out at oven temperature and quickly began cooling. Upon removal, individual crystals were picked out and wiped of solution. Mainly square-shaped $CsPbBr_3$ crystals with a size ranging from 5 to 10 mm in lateral length and 2-4 mm in thickness were obtained. The final crystals were washed with hexane solvent at room temperature. The area and thickness of the crystals are provided in Table 1.

TABLE 1

| CsPbBr₃ single crystals dimensions | | |
| --- | --- | --- |
| | Area (mm²) | Thickness (mm) |
| LP7-A | 9.42 × 9.08 | 2.29 |
| LP7-B | 7.98 × 6.58 | 2.74 |
| LP7-C | 5.51 × 5.03 | 2.14 |
| LP7-D | 5.93 × 4.48 | 1.49 |
| LP7-E | 11.51 × 4.11 | 2.55 |
| LP7-F | 11.55 × 7.89 | 4.15 |

Seeded Growth of Square-Shaped and Rectangular Crystals of CsPbBr₃ Single Crystals A quantity 3 mL of fresh crystallization solution at 60° C. was put in a scintillator vial. One small and square seed crystal with 1-2 mm lateral length was quickly transferred from the 100 mm crystallization dish to the vial. The vial was capped only halfway to allow slow solvent evaporation and was then put into the oven with the same growth procedure as for non-seeded growth. The areas and thicknesses of the crystals are provided in Table 2.

TABLE 2

| CsPbBr₃ single crystals dimensions | | |
| --- | --- | --- |
| | Area (mm²) | Thickness (mm) |
| a | 7.51 × 7.01 | 2.53 |
| b | 7.42 × 6.73 | 2.96 |
| c | 6.33 × 5.75 | 2.39 |
| d | 5.79 × 5.73 | 2.36 |

CsPbBr₃ crystal LP7-B was fabricated into a hard radiation detector. The detector has gallium indium eutectic alloy (GaIn) as a top metal electrode and Au as a bottom electrode, so the device has a structure GaIn/CsPbBr₃/Au.

Figure 2:
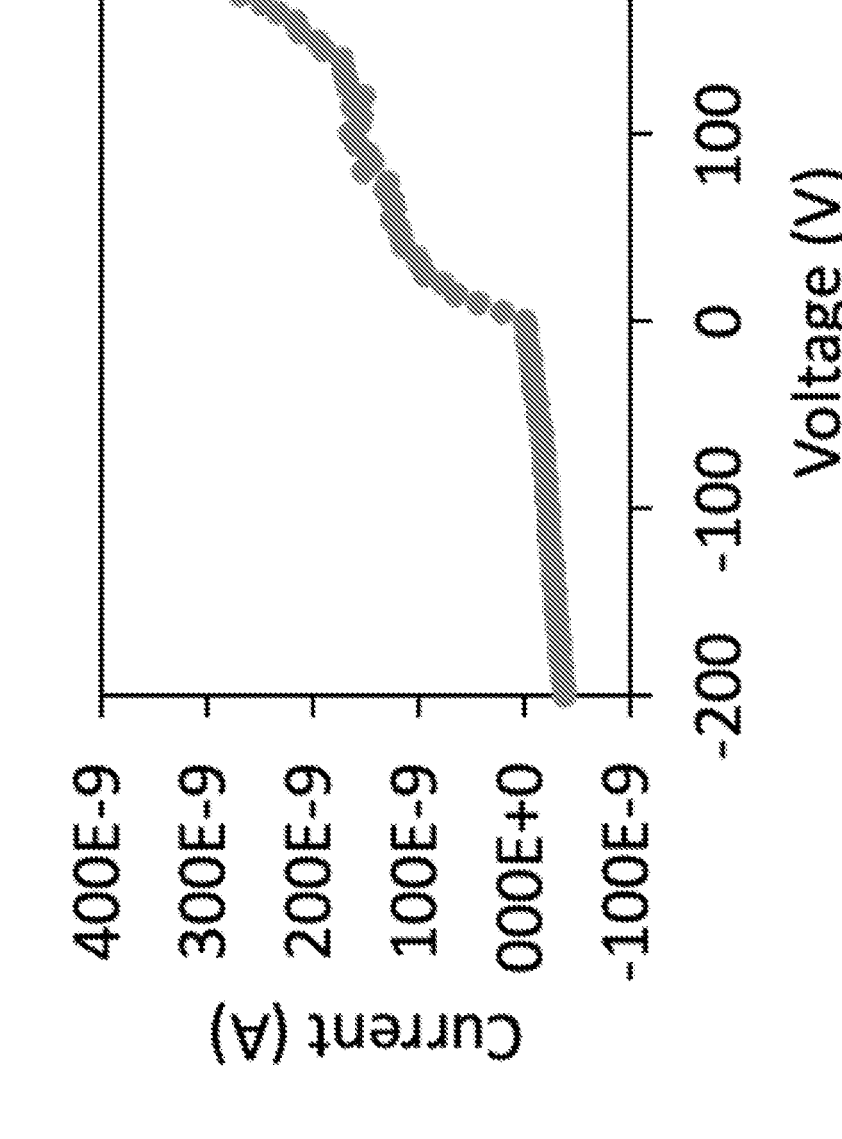
FIG. 2 shows a current-voltage (I-V) curve for detector LP7-B.
Figure 3:
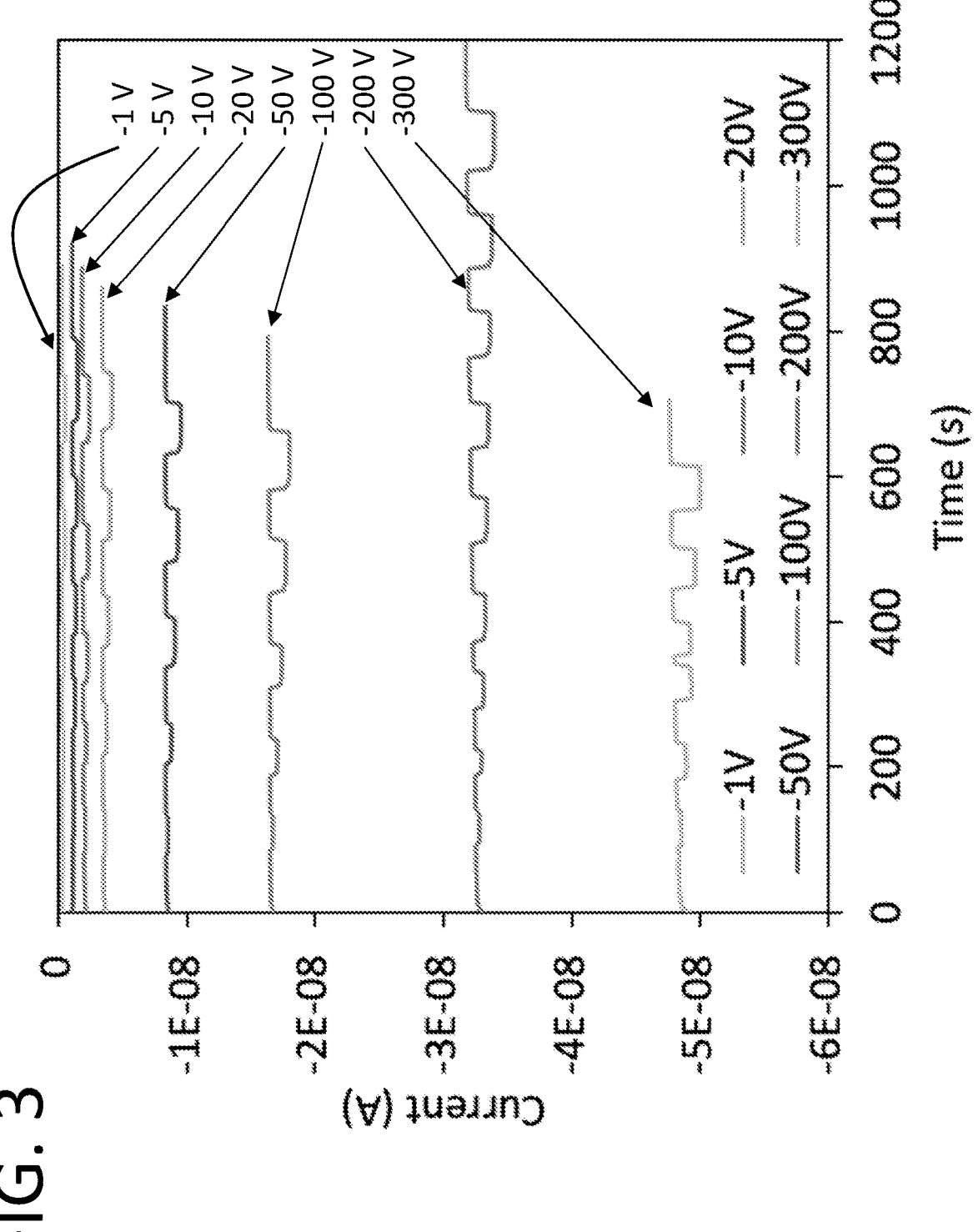
FIG. 3 shows detector LP7-B current response under lab X-ray.

The I-V curve of detector LP7-B did not show junction breakdown when reverse bias voltage was smaller than 300 V, which is shown in FIG. 2. The detector LP7-B current response under lab X-ray tube was stable, as shown in FIG. 3.

Figure 4:
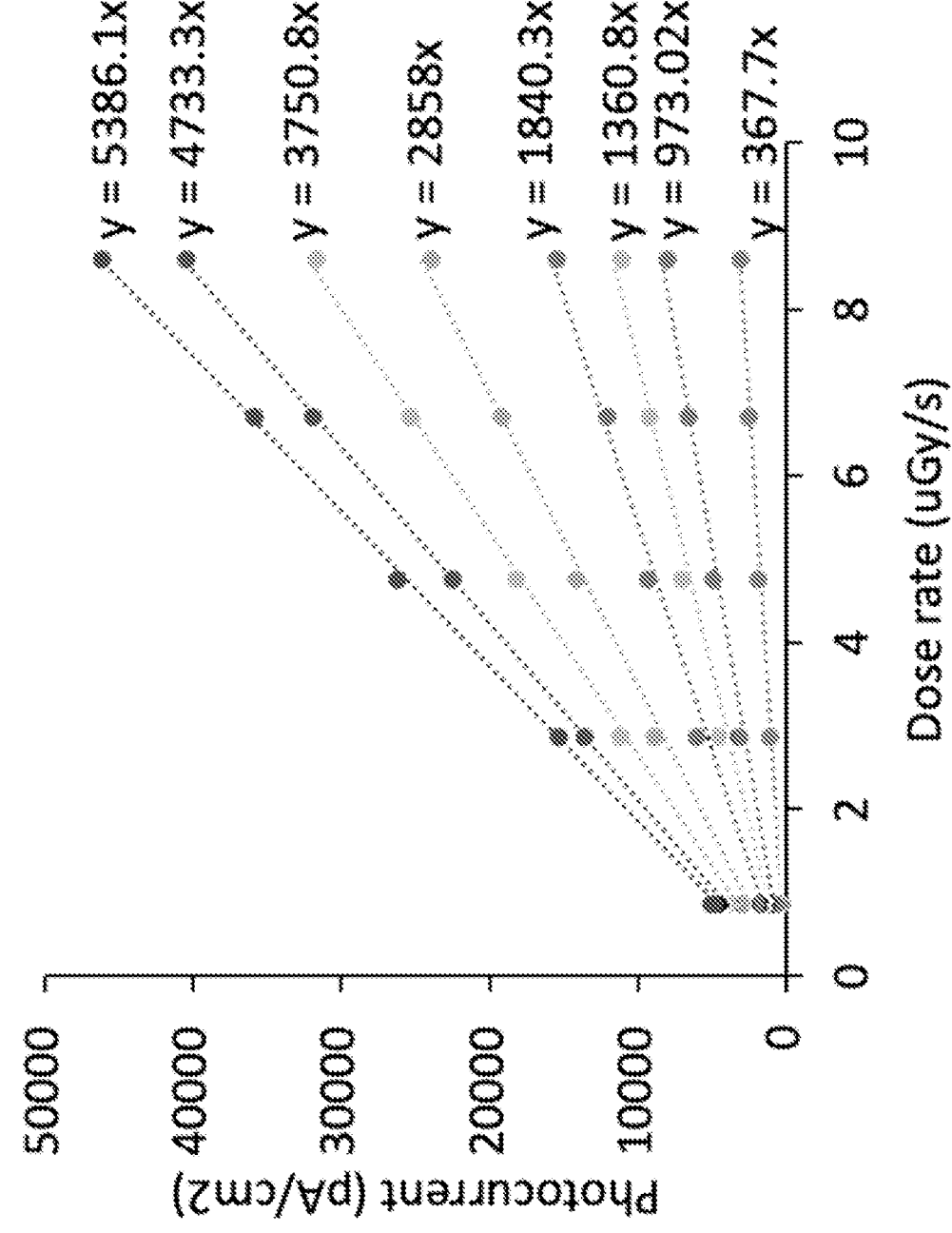
FIG. 4 shows LP7-B Photocurrent as function of X-ray dose rate.
Figure 5:
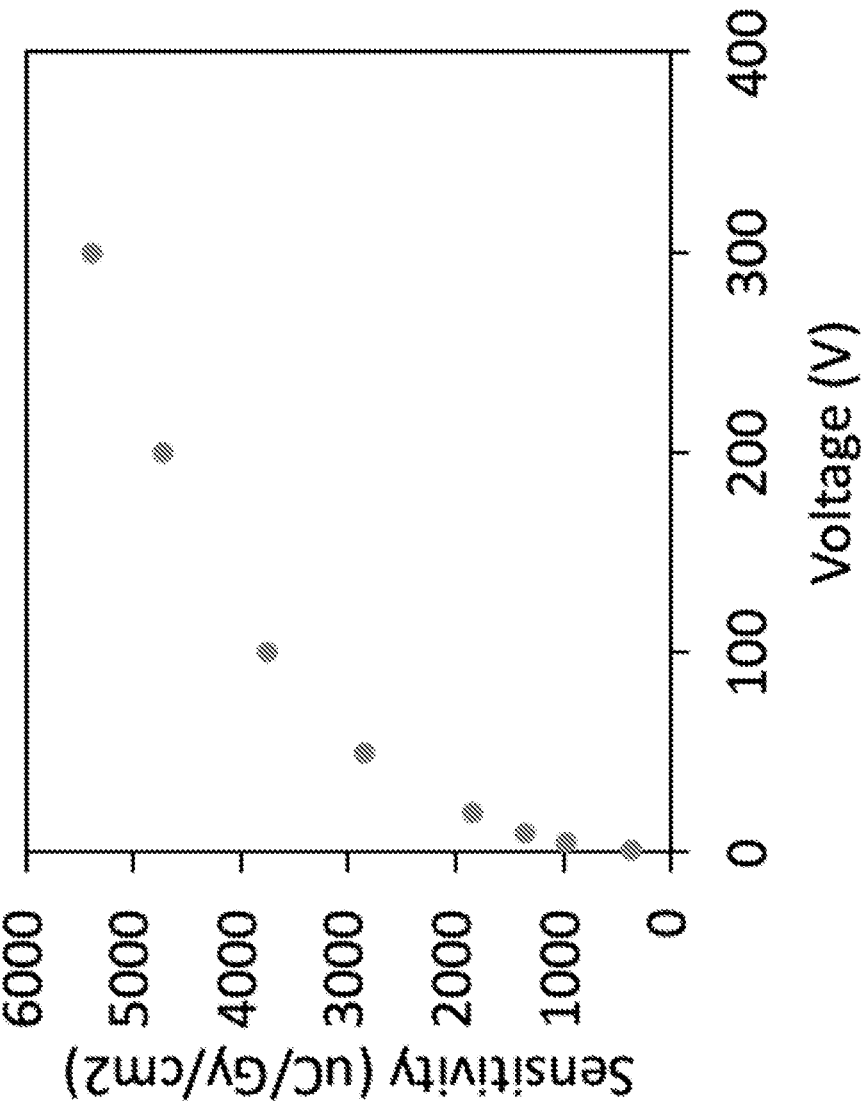
FIG. 5 shows LP7-B Sensitivity as function of detector reverse bias voltage.

Detector LP7-B photocurrent as a function of X-ray dose rate is plotted in FIG. 4. The sensitivity of Detector LP7-B increased as a function of detector reverse bias voltage and approached a saturation value, which is shown in FIG. 5. A high sensitivity ~5386 μC/Gy/cm² at reverse 300 V was achieved, and the detector dark current and signal current were stable. It should be noted that this detector was not optimized and that better results can be achieved using crystals made with the present methods. The data presented here is merely to show that the crystals are suitable for use in hard radiation detection.

Another detector LP13-3a was fabricated using crystal LP13-3a and the same electrodes as previously. A low detector dark current was achieved, that is, 14 nA at −200V. The detector LP13-3a current response under lab X-ray tube was very stable up to 1000 V, the limit of the testing instrument. Detector LP13-3a exhibited a photocurrent as a function of X-ray dose rate and the sensitivity of Detector LP13-3a increased as a function of detector reverse bias voltage and approached a saturation value. A high sensitivity ~10833 μC/Gy/cm² at reverse 1000 V was achieved, and the detector dark current and signal current were stable.

A third detector LP13-3d was fabricated using crystal LP13-3d and the same electrodes as before. A low detector dark current was achieved, that is, 13 nA at −200 V. The detector LP13-3d current response under lab X-ray tube was very stable up to 1000 V, the limit of the testing instrument. Detector LP13-3d exhibited photocurrent as a function of X-ray dose rate and the sensitivity of Detector LP13-3d increased as a function of detector reverse bias voltage and approached a saturation value. A high sensitivity ~10238 μC/Gy/cm² at reverse 1000 V was achieved, and the detector dark current and signal current were stable.

Detection of Synchrotron X-Rays

Figure 6:
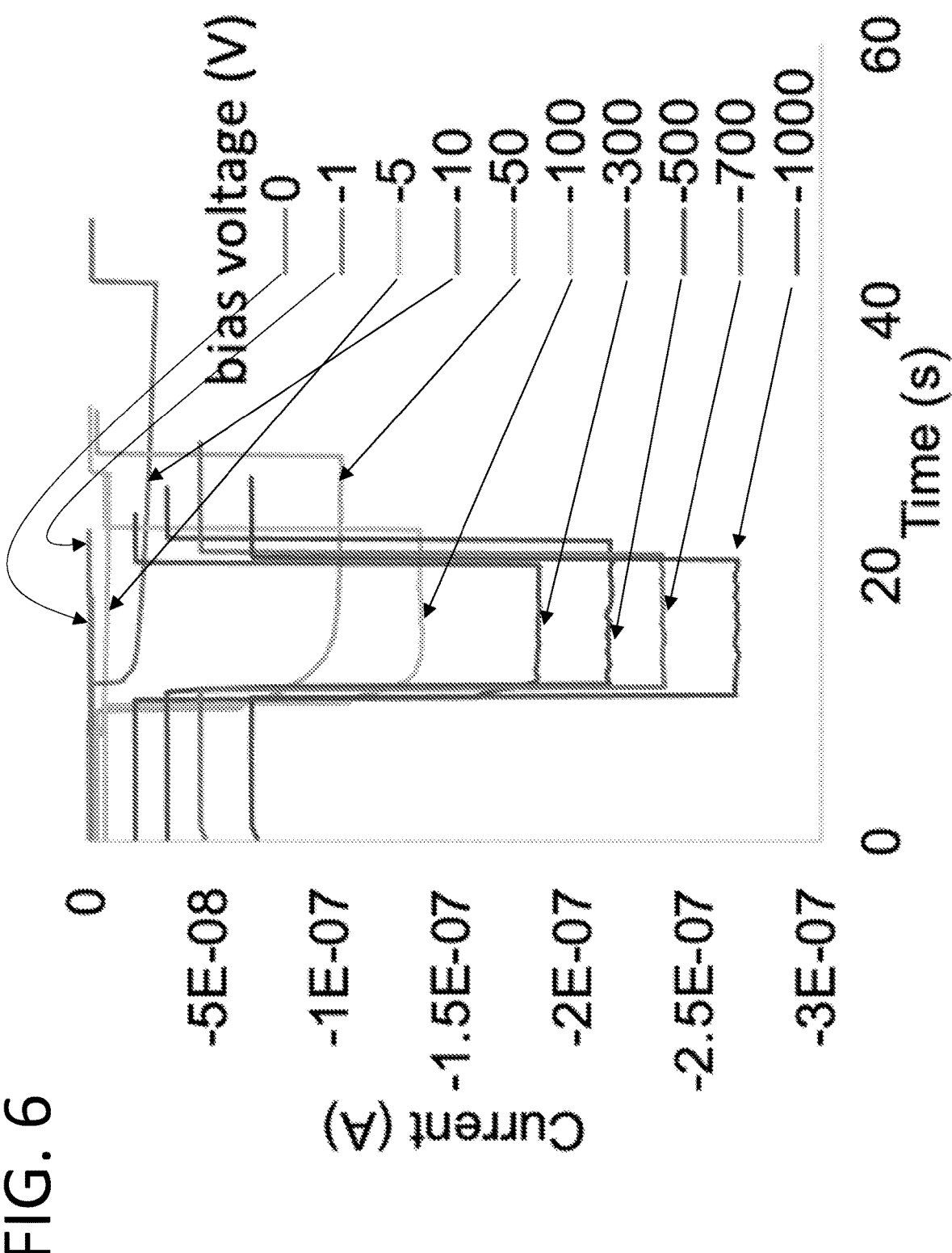
FIG. 6 shows detector current response to different applied bias voltage at a fixed synchrotron X-ray flux 3.4e9 photons/s/mm$^2$ (X-ray energy 58.6 keV).
Figure 7:
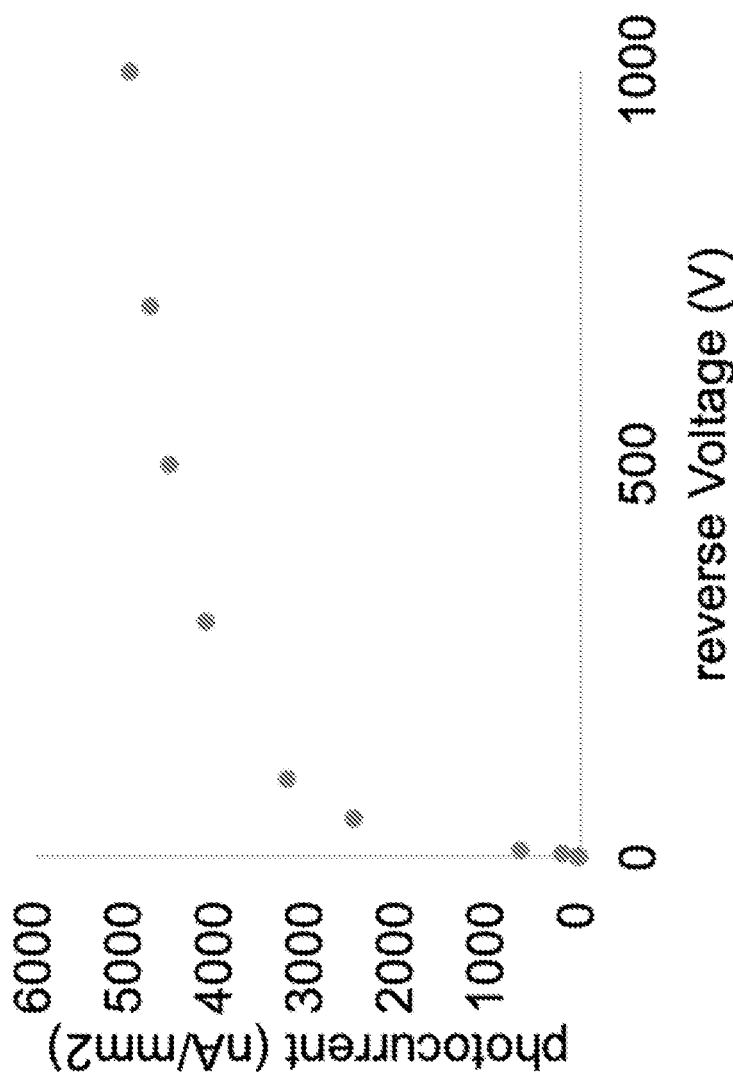
FIG. 7 shows photocurrent as a function of applied bias voltage at a fixed synchrotron X-ray flux 3.4e9 photons/s/mm$^2$ (X-ray energy 58.6 keV).

Detector LP13-3b was fabricated and was tested under synchrotron X-rays. The detector current response to different applied bias voltage at a fixed synchrotron X-ray flux is shown in FIG. 6. The detector dark current and signal current were stable. The photocurrent showed good saturation behavior as a function of applied bias voltage, which is shown in FIG. 7.

Figure 8:
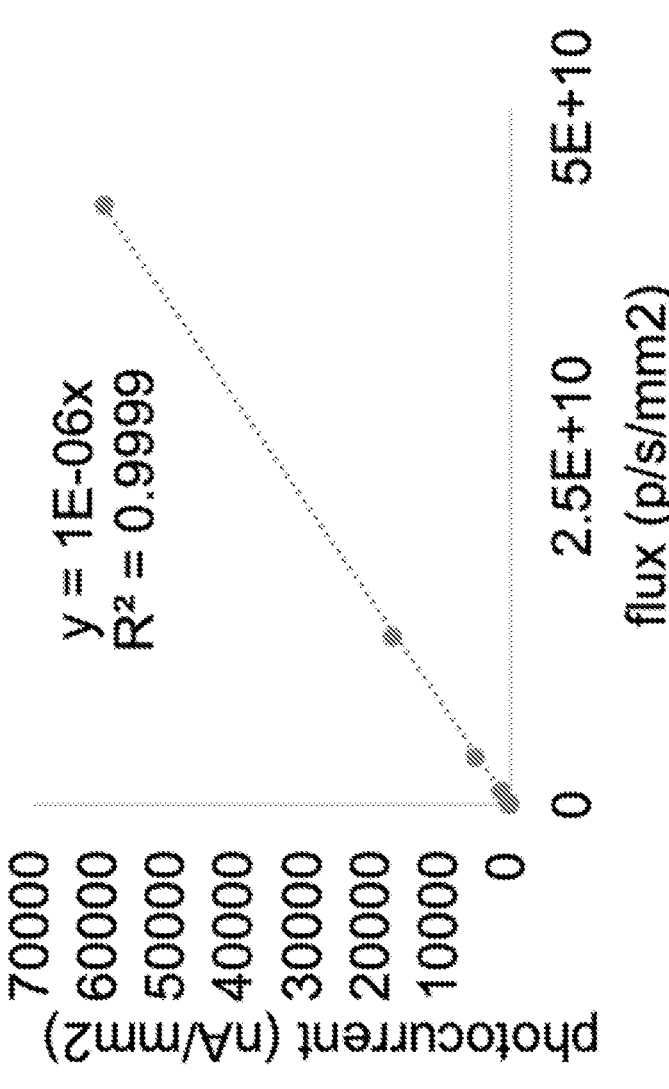
FIG. 8 shows detector LP13-3b photocurrent under synchrotron X-rays with different flux.

Detector LP13-3b showed stable and reproducible photocurrent under synchrotron X-rays with different flux, which is shown in FIG. 8. The plotted photocurrent shows an excellent linearity as a function of synchrotron X-ray flux up to 4.3e10 photons/s/mm² with X-ray energy 58.6 keV.

Example 2: Centimeter Sized Crystals of CsPbBr₃ Made with a Weak Organic Acid Additive This example illustrates methods for growing large crystals of CsPbBr₃ (at least 1 cm×1 cm wide and at least 1 mm thick) and related derivatives (e.g., CsPbX₃ X=combination of Cl, Br, I) using a weak organic acid (formic acid) additive.

Illustrative experimental process for large solution grown CsPbBr₃ crystals: The CsPbBr₃ precursor solution for crystal growth was obtained by dissolving CsBr (50 mmol) and PbBr₂ (100 mmol) as the precursors with a molar ratio of 1:2 in 48.5 mL dimethylsulfoxide (DMSO) solution. The solution was heated to 50° C. to accelerate the dissolution of these raw materials. After 5 hours, a transparent solution was obtained. Then 1.5 mL of formic acid was added to the transparent solution to obtain the final CsPbBr₃ crystallization solution. After stirring at 50° C. for 10 minutes, the crystallization solution was filtered into a new and clear crystallization dish using a 0.2 μm pore size polytetrafluoroethylene (PTFE) filter to remove impurities and small CsPbBr₃ crystals. Then, the crystallization dish was sealed with plastic wrap and transferred to an oven which was heated to 48° C. To grow CsPbBr₃ single crystals, the oven was heated from 48° C. to 120° C. at a heating rate of 5° C. per day. After about 15 days growth, several square-shaped CsPbBr₃ single crystals formed at the bottom of the crystallization dish. The crystals were harvested, dried, and sealed inside suitable storage media. The crystals of CsPbBr₃ had edge lengths of 1 cm.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" can mean or only or can mean "one or more." Embodiments of the inventions consistent with either construction are covered.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method for growing a perovskite single-crystal having the formula $(FA_xCs_{1-x})PbBr_3$, where $0 \leq x < 1$, the method comprising:

forming a crystallization solution comprising:

one or more $(FA_xCs_{1-x})PbBr_3$ perovskite precursors; and one or more alkyl ammonium salts having the formula $R_{(4-x)}H_xNX$, where the Rs are alkyl groups selected from methyl groups, ethyl groups, propyl groups, butyl groups, and combinations thereof, x has a value of 0 or 1, and X is a halide anion, nitrate anion, acetate anion, perchlorate anion, or sulfate anion dissolved in an organic solvent;

maintaining or ramping up the temperature of the crystallization solution for a time sufficient for the solvent to evaporate and the perovskite precursors to react and form the perovskite single-crystal; and optionally, transferring the perovskite single-crystal to a fresh batch of crystallization solution and maintaining or ramping up the temperature of the fresh crystallization solution for a time sufficient for the solvent to evaporate and the perovskite precursors to react and increase the size of the perovskite single-crystal;

wherein the perovskite single-crystal has at least one lateral dimension of 6 mm or greater and has a square shape or a rectangular shape with a rectangle aspect ratio of 3:1 or less.

2. The method of claim 1, wherein the perovskite single-crystal has at least one lateral dimension of at least 1 cm.

3. The method of claim 2, wherein the perovskite single-crystal has the formula $CsPbBr_3$.

4. The method of claim 2, wherein the perovskite single-crystal has the formula $(FA_xCs_{1-x})PbBr_3$, where $0 < x < 1$.

5. The method of claim 1, wherein the one or more alkyl ammonium salts comprise tetramethyl ammonium bromide.

6. The method of claim 1, wherein forming the crystallization solution comprises:

dissolving the $(FA_xCs_{1-x})PbBr_3$ perovskite precursors in the solvent at an elevated temperature to form a precursor solution; and adding the one or more ammonium salts to the precursor solution at an elevated temperature to form the crystallization solution.

7. The method of claim 1, wherein the method does not include the optional step of transferring the perovskite single-crystal to a fresh batch of the crystallization solution and maintaining or ramping up the temperature of the fresh crystallization solution for a time sufficient for the solvent to evaporate and the perovskite precursors to react and increase the size of the perovskite single-crystal.

8. The method of claim 1, wherein the method does include the optional step of transferring the perovskite single-crystal to a fresh batch of the crystallization solution and maintaining or ramping up the temperature of the fresh crystallization solution for a time sufficient for the solvent to evaporate and the perovskite precursors to react and increase the size of the perovskite single-crystal.

9. The method of claim 1, wherein the perovskite single-crystal has the formula $CsPbBr_3$.

10. The method of claim 1, wherein the perovskite single-crystal has the formula $(FA_xCs_{1-x})PbBr_3$, where $0 < x < 1$.

* * * * *